(12) United States Patent
Ding et al.

(10) Patent No.: US 8,566,759 B2
(45) Date of Patent: Oct. 22, 2013

(54) STRUCTURE FOR ON CHIP SHIELDING STRUCTURE FOR INTEGRATED CIRCUITS OR DEVICES ON A SUBSTRATE

(75) Inventors: Hanyi Ding, Essex Junction, VT (US); Kai D. Feng, Hopewell Junction, NY (US); Zhong-Xiang He, Essex Junction, VT (US); Xuefeng Liu, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 678 days.

(21) Appl. No.: 12/046,750

(22) Filed: Mar. 12, 2008

(65) Prior Publication Data

US 2009/0055790 A1 Feb. 26, 2009

Related U.S. Application Data

(63) Continuation-in-part of application No. 11/844,397, filed on Aug. 24, 2007.

(51) Int. Cl.
G06F 17/50 (2006.01)

(52) U.S. Cl.
USPC .......................................... 716/100; 716/101

(58) Field of Classification Search
USPC ........... 716/1, 8, 100–102; 361/683, 816–818
See application file for complete search history.

(56) References Cited

U.S. PATENT DOCUMENTS

| | | |
|---|---|---|
| 4,796,084 A | 1/1989 | Kamasaki et al. |
| 5,060,659 A | 10/1991 | Cook et al. |
| 5,151,769 A | 9/1992 | Immorlica, Jr. et al. |
| 5,811,882 A | 9/1998 | Latham, IV et al. |
| 6,307,252 B1 | 10/2001 | Knoedl et al. |
| 6,432,754 B1 * | 8/2002 | Assaderaghi et al. ........ 438/149 |
| 6,998,712 B2 | 2/2006 | Okada et al. |
| 7,119,420 B2 | 10/2006 | Tzu |
| 7,681,152 B2 * | 3/2010 | Short et al. .................... 716/100 |
| 2002/0130916 A1 | 9/2002 | Gulvin et al. |
| 2002/0148979 A1 * | 10/2002 | Featherby et al. ......... 250/515.1 |
| 2003/0025180 A1 | 2/2003 | Alcoe et al. |
| 2006/0096773 A1 | 5/2006 | Cochrance |
| 2006/0180916 A1 | 8/2006 | Wyland |

(Continued)

FOREIGN PATENT DOCUMENTS

JP 03-155653 7/1991

OTHER PUBLICATIONS

Final Office Action dated Feb. 22, 2011 in U.S. Appl. No. 11/844,397.
Office Action dated Sep. 2, 2010 in U.S. Appl. No. 11/844,397.

(Continued)

*Primary Examiner* — Binh Tat
(74) *Attorney, Agent, or Firm* — Anthony Canale; Roberts Mlotkowski Safran & Cole, P.C.

(57) ABSTRACT

A design structure is embodied in a machine readable medium for designing, manufacturing, or testing an integrated circuit. The design structure comprises: a conductive structure surrounding and accommodating a circuit or a circuit device arranged on a substrate and at least one feed through capacitor and one transmission line associated with the conductive structure and providing the power supply and signals to the circuit or circuit device respectively. The design structure also comprises a shielding structure surrounding a circuit or a circuit device arranged on a substrate and at least one feed through capacitor or a transmission line arranged on a side of the shielding structure.

1 Claim, 13 Drawing Sheets

(56) References Cited

U.S. PATENT DOCUMENTS

| | | |
|---|---|---|
| 2006/0192265 A1 | 8/2006 | Hsu |
| 2006/0237823 A1 | 10/2006 | Spielberger et al. |
| 2006/0272857 A1* | 12/2006 | Arnold .......................... 174/377 |
| 2007/0298526 A1* | 12/2007 | Berry et al. ..................... 438/14 |
| 2008/0158851 A1 | 7/2008 | Cochrance |
| 2008/0282212 A1* | 11/2008 | Dennison et al. ............... 716/10 |
| 2009/0052153 A1* | 2/2009 | Ding et al. .................... 361/818 |

OTHER PUBLICATIONS

Office Action dated Jul. 31, 2012, for U.S. Appl. No. 11/844,397; 16 pages.

Office Action dated Feb. 14, 2013 for U.S. Appl. No. 11/844,397; 19 pages.

Notice of Allowance dated Jul. 12, 2013 for U.S. Appl. No. 11/844,397; 14 pages.

\* cited by examiner

A-A

B-B

D-D

E-E

STRUCTURE FOR ON CHIP SHIELDING STRUCTURE FOR INTEGRATED CIRCUITS OR DEVICES ON A SUBSTRATE

CROSS REFERENCE TO RELATED APPLICATIONS

The present application is a continuation-in-part of application Ser. No. 11/844,397, filed on Aug. 24, 2007, the contents of which are incorporated by reference in their entirety herein.

BACKGROUND OF THE INVENTION

1. Field of the Invention

The invention relates to a design structure, and more particularly, to a designs structure for electromagnetic on chip shielding of a circuit (e.g., plurality of devices) and/or one or more devices formed on a semiconductor substrate.

2. Background Description

In an attempt to solve RF interference problems, shielding structures in the metal level of a substrate have been utilized, but typically without a high doping layer in the substrate. Such structures also typically do not protect the devices in the substrate. They also lack feed through connection interface devices without degrading the shielding effectiveness such as feed through capacitors for the supply of power connections and DC signal connections, and/or transmission lines for the AC signal connections.

In high frequency, wide bandwidth and high gain applications, radiation shielding is becoming more and more necessary. This is particularly true in, e.g., cellular systems, which are very popular and which have to cope with lots of radiation signals in the air. Such signals can enter a cellular transceiver chip as unwanted signals and disturb the cellular phone operation. The path of an unwanted signal can enter the system either by direct radiation and/or by a metal connection, such as power connections. Furthermore, current system level shielding is expensive and incomplete due to many holes, e.g., holes for display and operation buttons, which exist in the shielding. In millimeter wave applications, the wavelength is approaching the connection length inside of a die and the radiation interference in a chip is getting stronger and stronger.

The protection of circuits sensitive to magnetic fields has also been utilized. One such method uses passivation of silicon dioxide or silicon nitride, i.e., isolated materials. However, these materials cannot be used to shield RF interference. Another method provides for dispersing of a shielding material powder. However, this is not usable as a high doping layer in a substrate.

The shielding of modules (package level) is also known. However, this shielding is not typically used in chip shielding and does not utilize feed through capacitors and/or transmission lines.

It is also known to construct an electromagnetic interference shield in a package assembling process. However, such shielding is not utilized for on-chip shielding and does not utilize transmission lines and/or feed through capacitors to minimize the possible leakage through connection openings.

A seal ring has been used to surround an LSI circuit to prevent dicing and bonding crack, and to improve moisture resistance. Such arrangements can use metal wiring and doping in silicon for the seal ring. However, such arrangements are not typically utilized for electromagnetic shielding. Furthermore, they typically lack a bottom conductive layer and a top wiring layer, and do not form a full box.

Packaging EMI has also been utilized, but not for chip shielding. Such packaging also does not utilize feed through capacitors or transmission lines, and does not form a complete shielding structure.

Accordingly, there exists a need in the art to overcome the deficiencies and limitations described hereinabove.

SUMMARY OF THE INVENTION

In a first aspect of the invention, a design structure is embodied in a machine readable medium for designing, manufacturing, or testing an integrated circuit. The design structure comprises a conductive structure surrounding and accommodating a circuit or a circuit device arranged on a substrate and at least one feed through capacitor and one transmission line associated with the conductive structure and providing the power supply and signals to the circuit or circuit device respectively.

In a second aspect of the invention, a design structure is embodied in a machine readable medium for designing, manufacturing, or testing an integrated circuit. The design structure comprises a shielding structure surrounding a circuit or a circuit device arranged on a substrate and at least one feed through capacitor or a transmission line arranged on a side of the shielding structure.

DETAILED DESCRIPTION OF EMBODIMENTS OF THE INVENTION

The invention relates to a design structure, and more particularly, to a design structure for electromagnetic shielding of a circuit (e.g., plurality of devices) and/or one or more devices formed on a semiconductor substrate, and a method of shielding devices and/or a circuit.

The invention relates to a design structure for electromagnetic shielding of a circuit (e.g. plurality of devices) and/or one or more devices formed on a semiconductor substrate, and a method of shielding devices and/or a circuit. The shielding has the form of a conductive structure surrounding and accommodating the circuit (or devices).

The invention relates to a design structure for electromagnetic shielding of a circuit (e.g. plurality of devices) formed on a semiconductor substrate. The shielding forms a conductive structure surrounding and accommodating the circuit (or devices). The invention also relates to a method of shielding devices and/or circuits.

According to an embodiment of the invention, devices are formed in a silicon substrate and a conductive shielding structure, having the form of a three-dimensional (3D) structure (e.g. box), surrounding the devices. The box has a bottom that can be formed by doping regions in the substrate, sidewalls that can be formed by doping regions or forming vias in the substrate, and, in particular, via bars, and a top that can be in the form of an interconnect layer, e.g., a metal layer. The conductive shielding structure can thus include portions which comprise metal, doped semiconductor regions, or the like.

According to another embodiment, a shielding structure is utilized to surround a chip device and has the form of a six side structure or box that utilizes, among other things, a conductive high doping bottom layer, sides formed in the substrate, and either a feed through capacitor (supplying DC signals) or a transmission line (supplying AC signals) arranged on one of the sides of the box structure.

Figure 1:
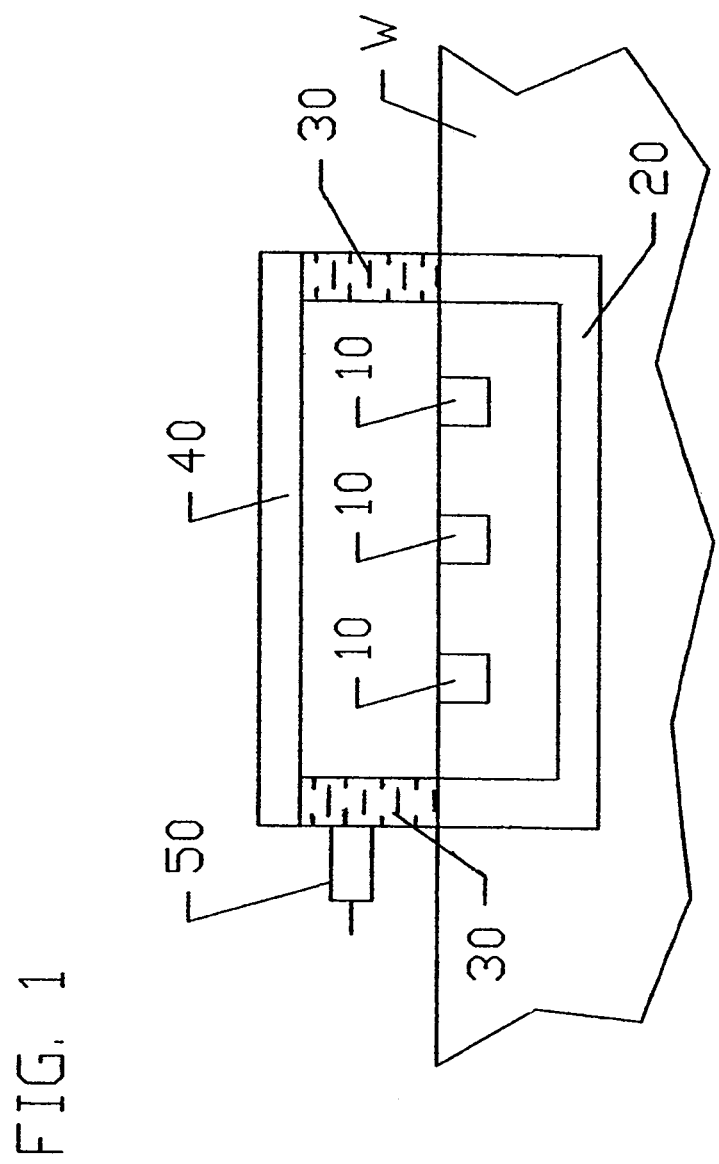
FIG. 1 shows a side view of a shielding box completely surrounding and shielding a circuit made of devices arranged on a wafer in accordance with the invention.

FIG. 1 shows one embodiment of a shielding box utilizing a high or top level metal cover 40, a bottom 20 having the form of a high doping layer with high conductivity, and side walls 30 having the form of contacts/vias and metal layers. By way of example, the cover 40 can be copper having a thickness of about 4 µm, the bottom layer 20 can be a high doping layer having a thickness of about 2 µm, and the side walls 30 can have the form of conductive via and/or contact bars, metal layers, and highly doped silicon layers.

One or more feed through devices 50 are associated with the shielding box. The device(s) 50 is arranged on one of the sides such as on one of the via sidewalls 30. The feed through device 50 functions to provide power to one or more devices 10 arranged on a wafer W. The advantage of the feed through device 50 is that it can be designed with different cut off frequencies for different types of signals. By way of example, the devices 10 can be part of a circuit or can be circuit devices, and can be, in particular, a low noise amplifier. The device 50 can, in particular, supply input and output signals (DC or AC) to and from the devices 10 and into and out of the shielding box. When the devices 10 are digital devices or devices utilizing DC signals, the feed through device 50 can be a feed through capacitor or DC feed through device.

Figure 2:
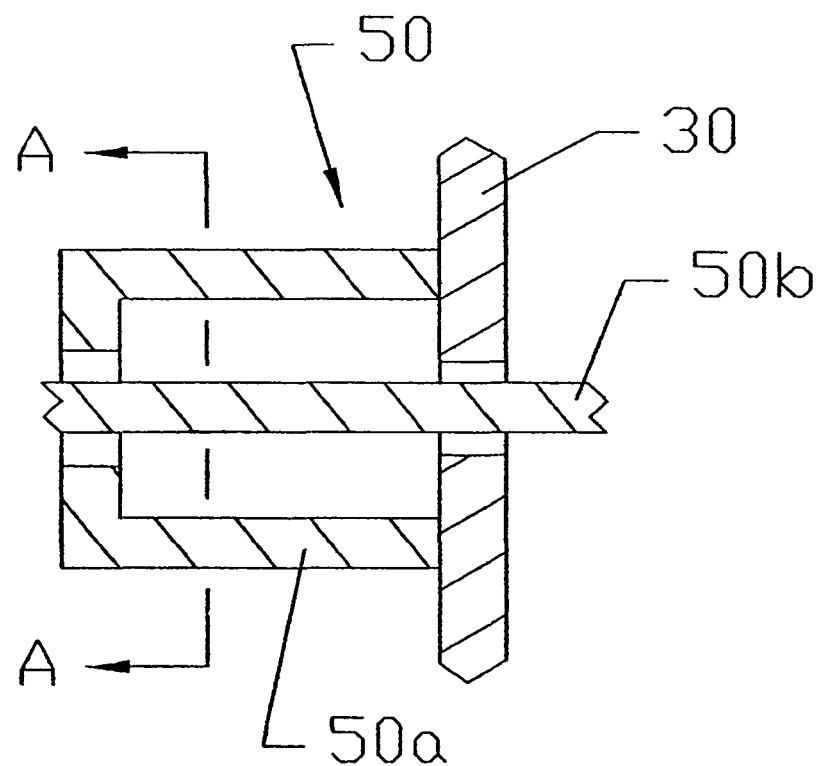
FIG. 2 shows an enlarged cross-section view of a DC power supply connection which can be used on the box of FIG. 1, and which has the form of a feed through capacitor.
Figure 3:
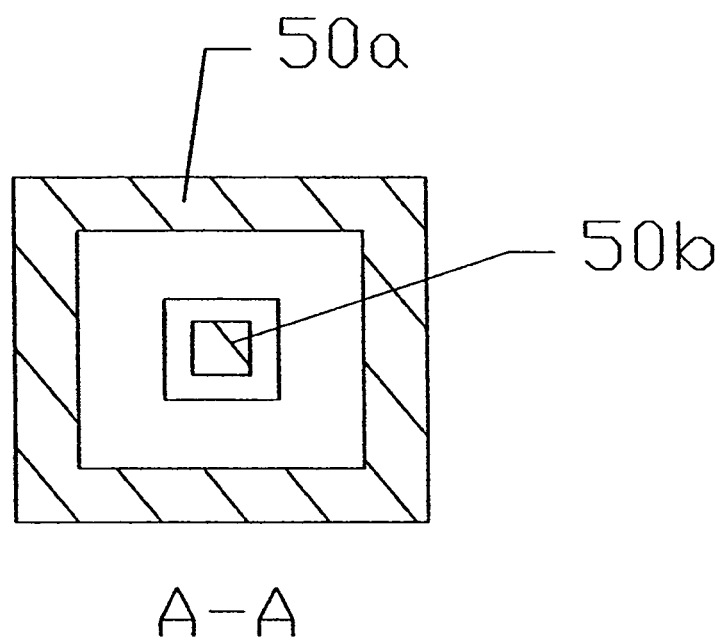
FIG. 3 shows a section A-A view of FIG. 2.

FIGS. 2 and 3 show a feed through capacitor 50 arranged on a sidewall 30 of the shielding box. The feed through capacitor 50 has an outer member 50a and an inner member 50b. The outer member 50a has one end coupled to the sidewall 30 and another end surrounding the inner member 50b. The inner member 50b passes through the outer member 50a and the sidewall 30.

When the devices 10 are high frequency devices, devices utilizing AC signals, or devices utilizing controlled impedance transmission lines, the feed through device can be an AC feed through device which has a required line inductance to capacitance ratio for the given characteristic impedance.

Figure 4:
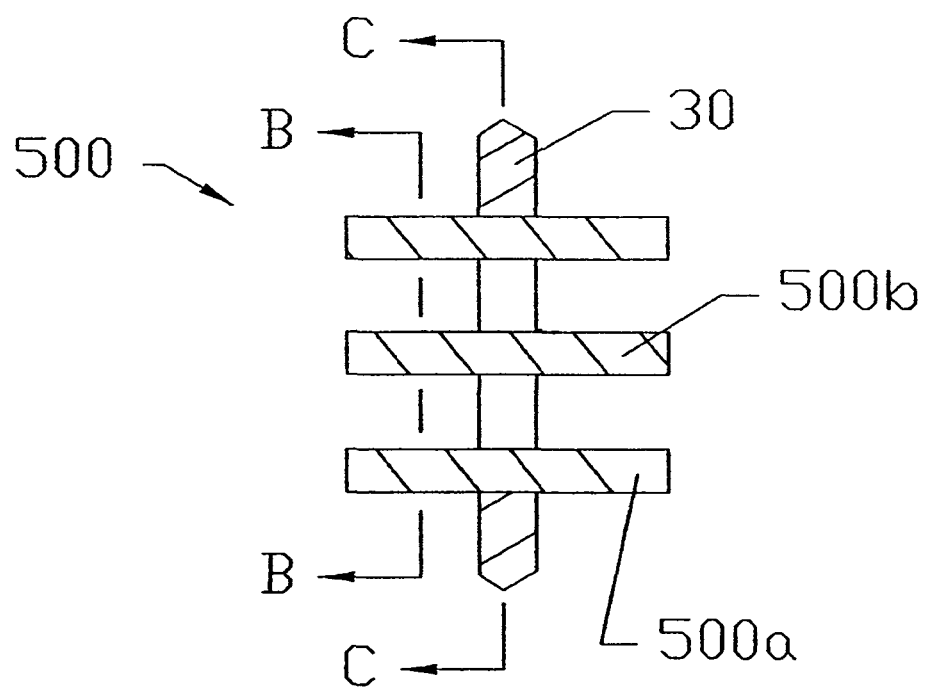
FIG. 4 shows an enlarged cross-section view of an AC signal path which can be used on the box of FIG. 1, and which can have the form of a feed through stripline.
Figure 5:
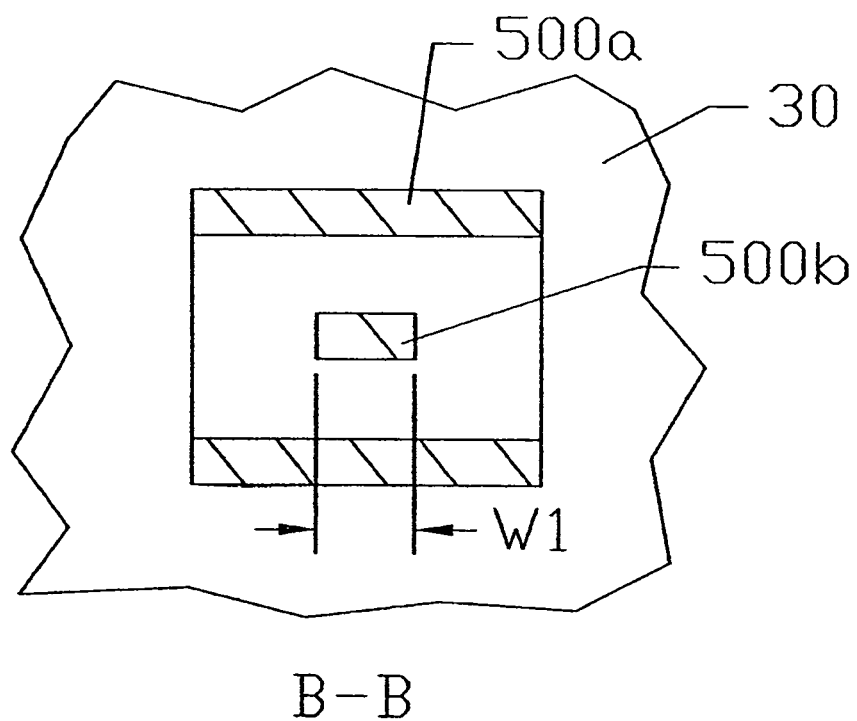
FIG. 5 shows a section B-B view of FIG. 4.
Figure 6:
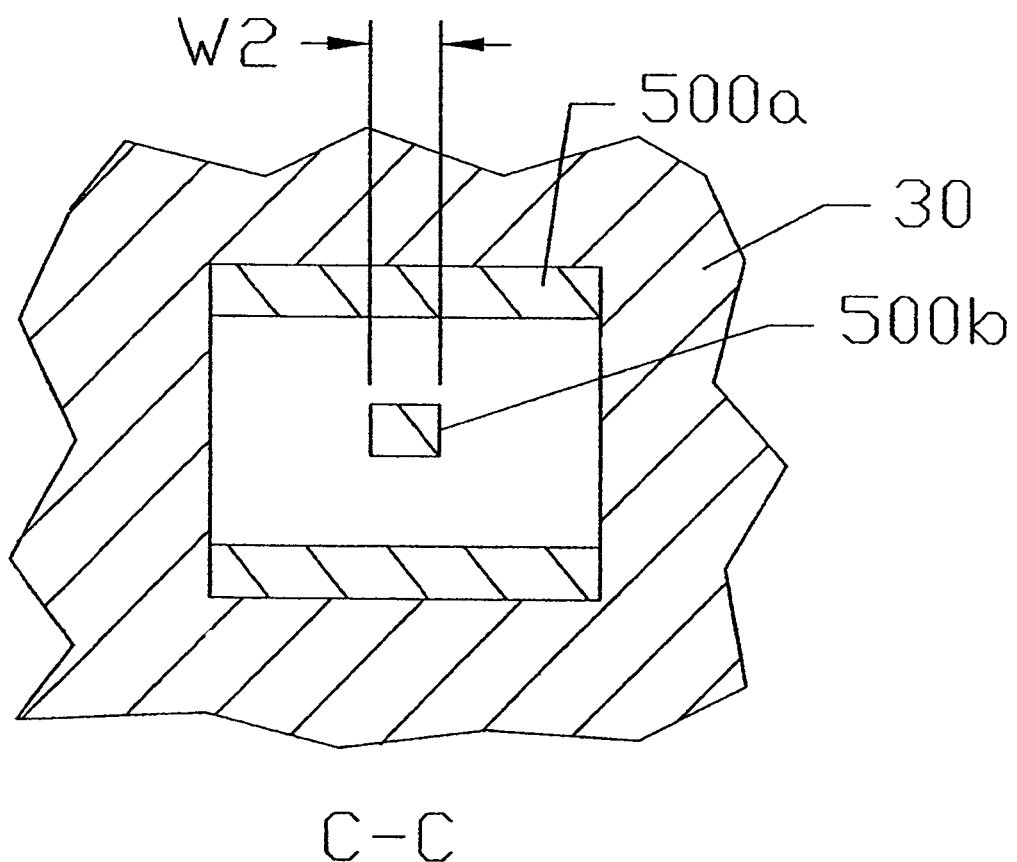
FIG. 6 shows a section C-C view of FIG. 4.

FIGS. 4-6 show such an AC feed through device 500 in the form of a stripline. As is shown in FIG. 4, the feed through stripline 500 has one or more outer members 500a and an inner member 500b. The outer members 500a have one end extending out from one side of the sidewall 30 and another end extending out from an opposite side of the sidewall 30 and into the shielding box. The outer members 500a surround all or part of the inner member 500b. The inner member 500b passes within and through the outer member 500a and also through the sidewall 30.

FIGS. 4 and 5 show that the inner member 500b crossing the sidewall 30 of the shielding box and the outer member 500a have different line widths. The width W1 of member 500b through section B-B shown in FIG. 5 can be greater than the width W2 of member 500b through section C-C shown in FIG. 6 in order to compensate for the wall effect on the characterization impedance.

When the devices 10 are high frequency devices, devices utilizing AC signals, or devices utilizing controlled impedance transmission lines, the feed through device can alternatively be an AC feed through device which has a required line inductance to capacitance ratio for the given characteristic impedance.

Figure 7:
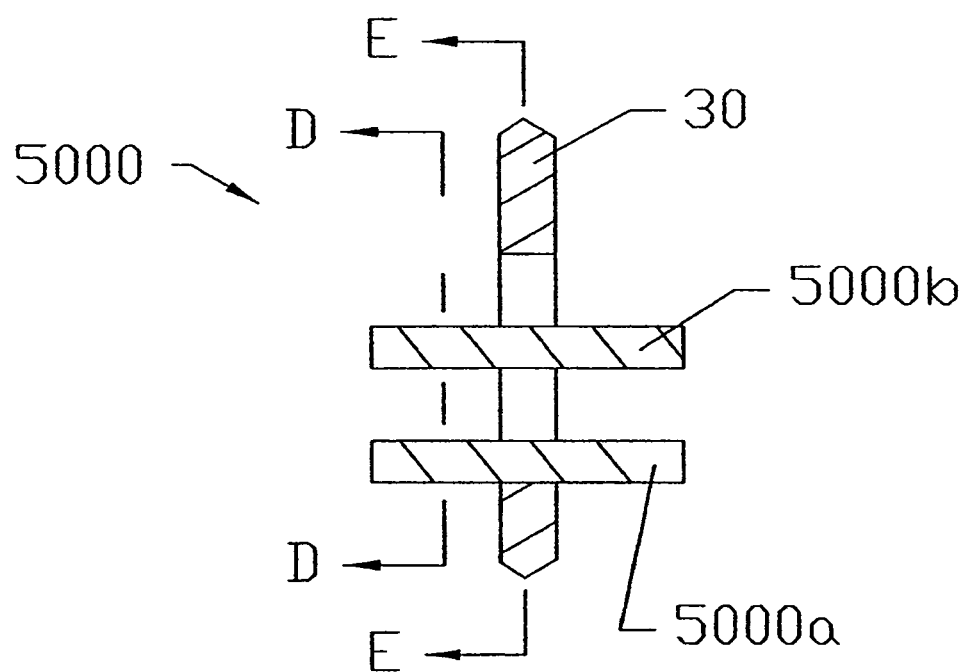
FIG. 7 shows an enlarged cross-section view of an AC signal path which can be used on the box of FIG. 1, and which can have the form of a feed through micro-stripline.
Figure 8:
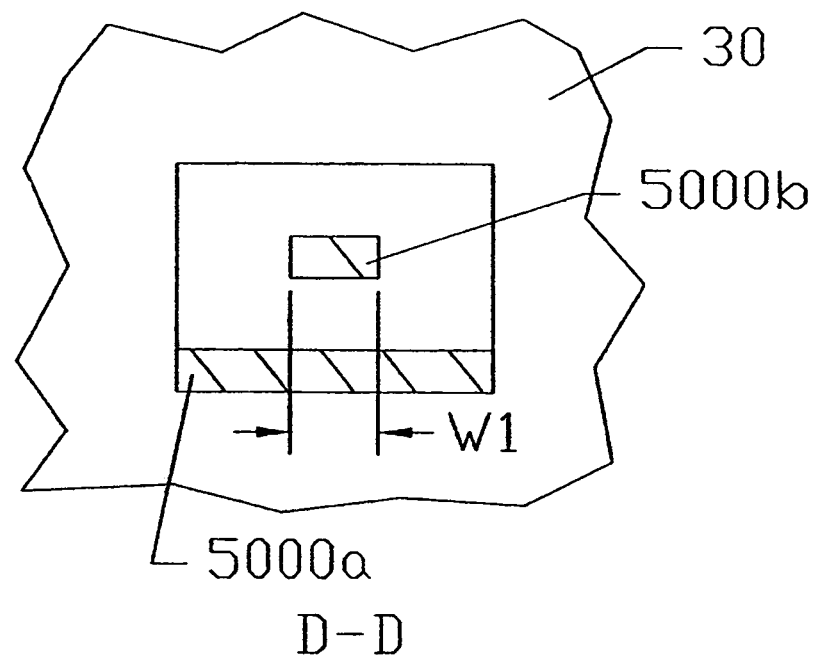
FIG. 8 shows a section D-D view of FIG. 7.
Figure 9:
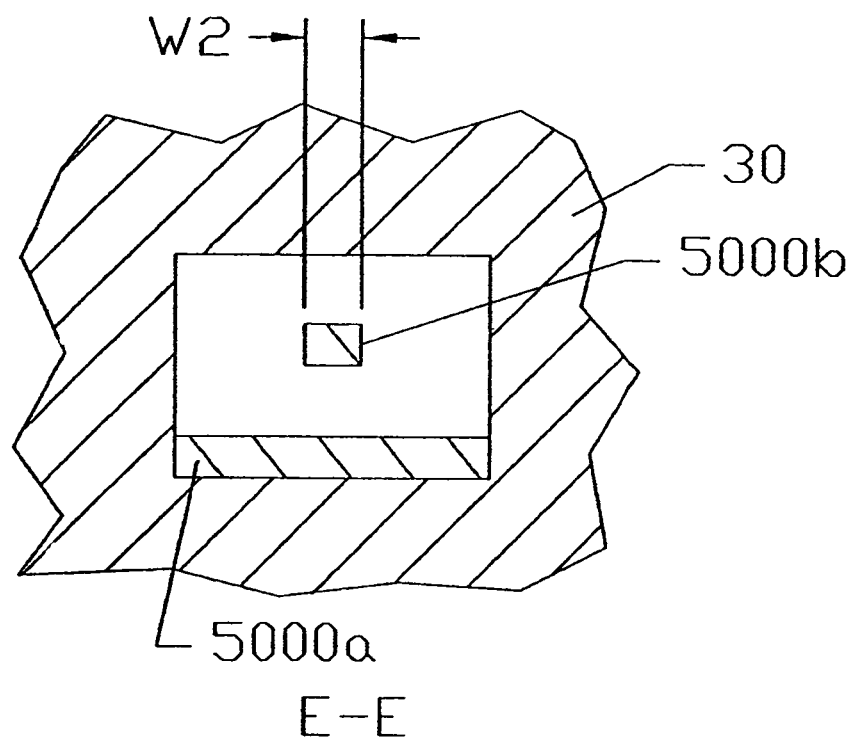
FIG. 9 shows a section E-E view of FIG. 7.

FIGS. 7-9 show an alternative AC feed through device 5000 in the form of a micro-stripline. As is shown in FIG. 7, the feed through micro-stripline 5000 has one outer member 5000a and an inner member 5000b. The outer member 5000a has one end extending out from one side of the sidewall 30 and another end extending out from an opposite side of the sidewall 30 and into the shielding box. The outer member 5000a surrounds part of the inner member 5000b. The inner member 5000b is spaced from the outer member 5000a and through the sidewall 30.

FIGS. 8 and 9 show that the inner member 5000b crossing the sidewall 30 of the shielding box and the outer member 5000a have different line widths. The width W1 of member 5000b through section D-C shown in FIG. 8 can be greater than the width W2 of member 5000b through section E-E shown in FIG. 9 in order to compensate for the wall effect on the characterization impedance.

Figure 10:
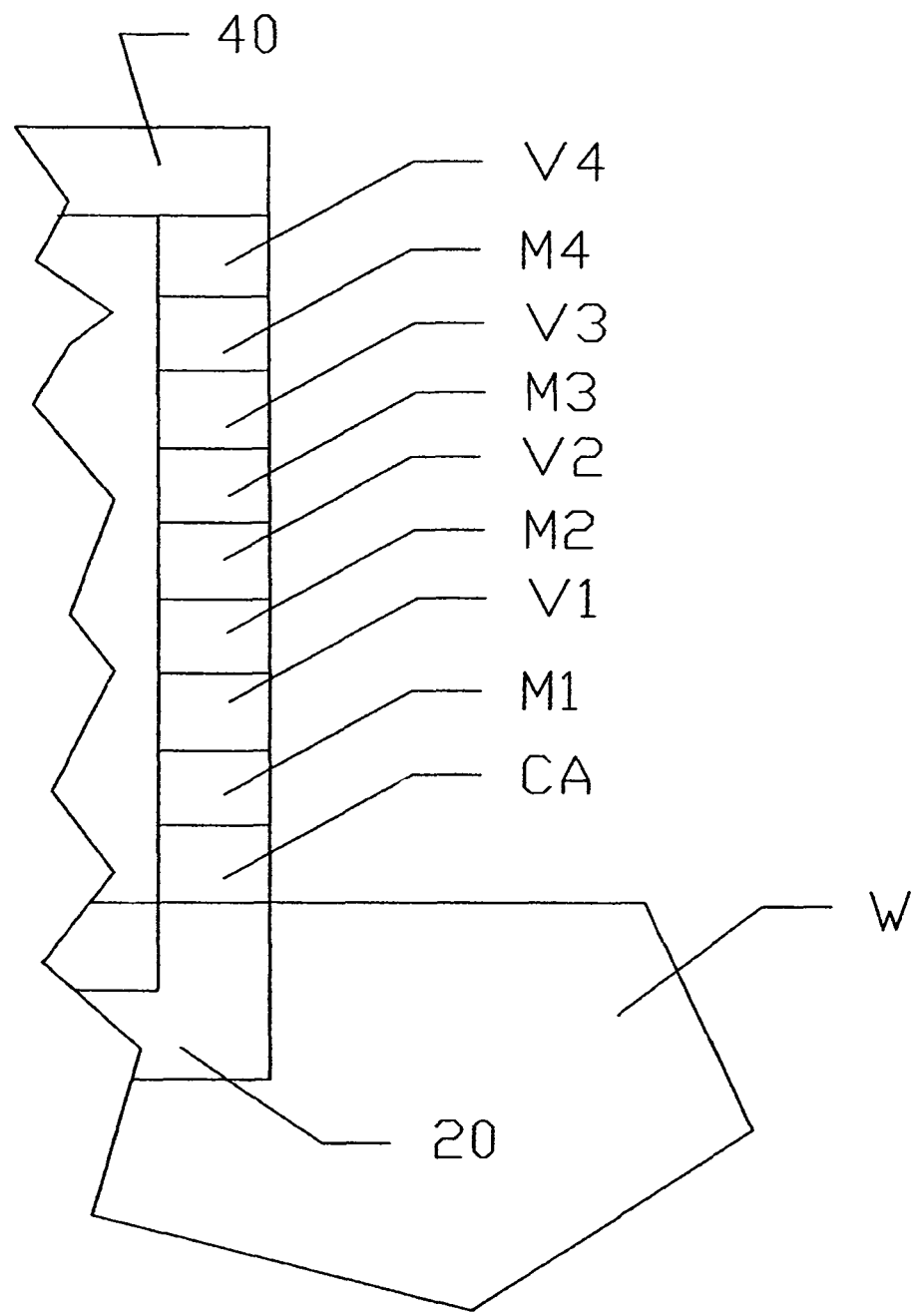
FIG. 10 shows an enlarged partial view of the box of FIG. 1 and illustrates the various layers which make up the via sidewalls of the shielding box.

FIG. 10 shows one non-limiting way in which the sidewall (s) 30 can be configured as a multi-layered structure. The via-metal sidewall 30 can have a first layer CA which extends between the bottom 20 and up to an area of M1 above the surface of the wafer W. A layer of CA extends from the high doping layer to M1, A layer V1 extends from layer M1 to layer M2, A layer V2 extends from layer M2 to layer M3. Layer V3 extends from layer M3 to layer M4, Finally, layer V4 extends from layer M4 to cover 40. By way of example, the layers CA, M1,V1 M2,V2, M3, V3,M4 and V4—can also be wiring levels which include, e.g., copper.

Figure 11:
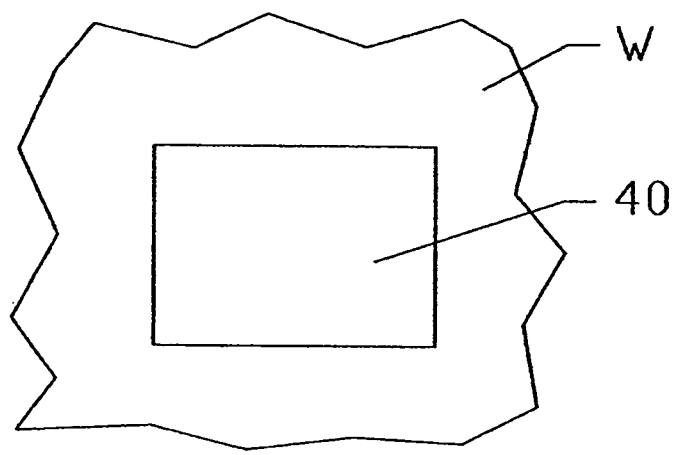
FIGS. 11-14 show top views of various optional shapes that can be utilized for the shielding box in accordance with the invention.

FIG. 11 shows a top view of one non-limiting shape for the shielding box arranged on a wafer W. As is apparent from the shape of the cover 40, the shielding box can be polygonal or rectangular.

Figure 12:
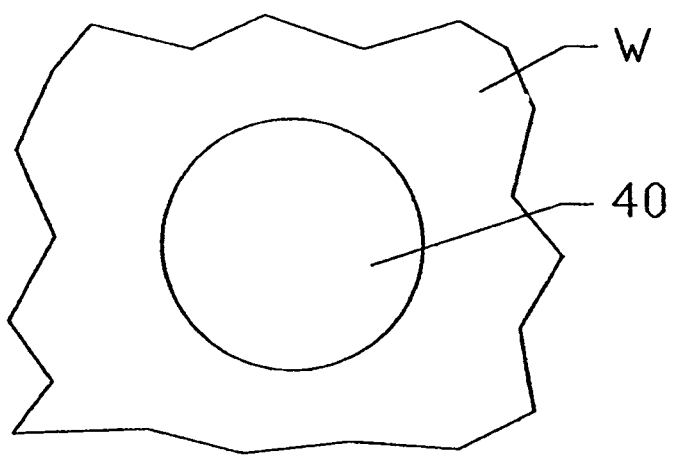

FIG. 12 shows a top view of another non-limiting shape for the shielding box arranged on a wafer W. As is apparent from the shape of the cover 40, the shielding box can be circular or round.

Figure 13:
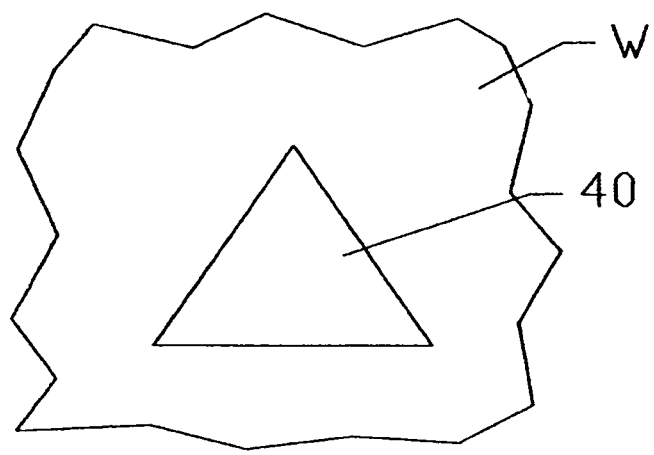

FIG. 13 shows a top view of another non-limiting shape for the shielding box arranged on a wafer W. As is apparent from the shape of the cover 40, the shielding box can be triangular or three-sided.

Figure 14:
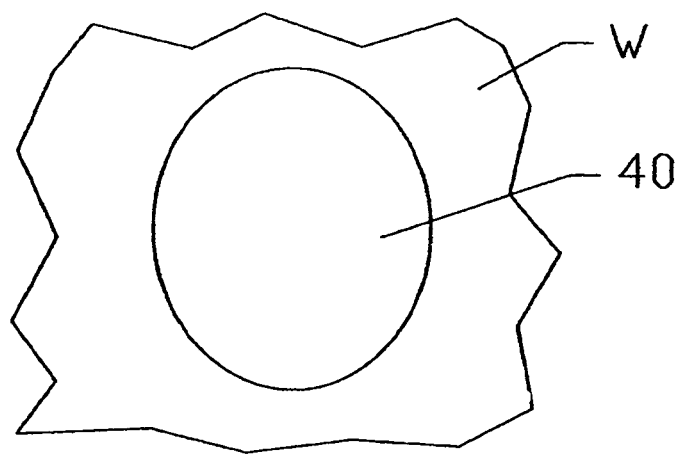

FIG. 14 shows a top view of another non-limiting shape for the shielding box arranged on a wafer W. As is apparent from the shape of the cover 40, the shielding box can be elliptical, oval or egg-shaped. Of course, other shaped are also contemplated.

With the shielding box according to the invention, simulations have shown that the isolation improvement can be significant. For example, over the frequency range of 1 to 110 GHz, the improvement can be from between about 2 dB to about 5 dB when spaced apart transmission lines are terminated at both ends and the lines have well defined return paths to between about 20 and about 30 dB (i) when spaced apart transmission lines have only outside ends terminated and the lines do not have well defined return paths, or (ii) when spaced apart transmission lines have both ends terminated and the lines do not have well defined return paths, or (iii) when spaced apart transmission lines have only outside end terminated and the lines do have well defined return paths.

The shielding box of the invention can thus improve the isolation significantly depending on the signal and noise line configurations. For example, when mismatched lines are used (i.e., one end terminated with 50 ohms, the other end having an open circuit), the isolation improvement can be 20 dB and higher no matter whether the lines (signal or noise) have well defined return path or not. Furthermore, even when load matching is utilized and there is a well defined return path, the isolation improvement can be from 2 to 5 dB. In design for the real world, however, it is very difficult to get a well defined return path and maintain perfect match. Accordingly, the shielding box can be very useful in reducing coupling between different circuit blocks.

DESIGN STRUCTURE

Figure 15:
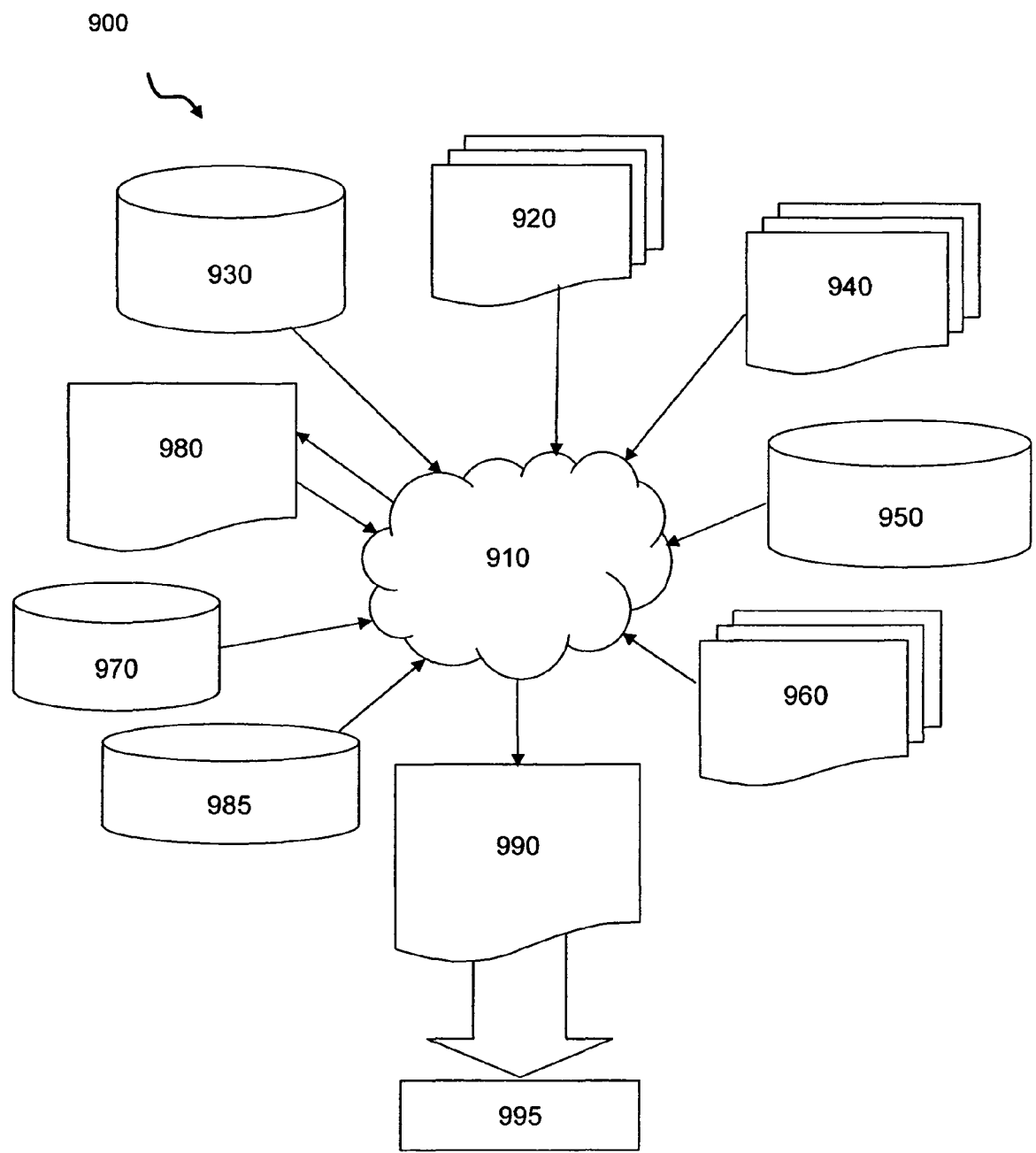
FIG. 15 is a flow diagram of a design process used in semiconductor design, manufacture, and/or test.

FIG. 15 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design from 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in, for example, FIGS. 1, 2, 4, 7 and 10-14 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in, for example, FIGS. 1, 2, 4, 7 and 10-14. Design process 910 preferably synthesizes (or translates) an embodiment of the invention as shown in, for example, FIGS. 1, 2, 4, 7 and 10-14 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in, for example, FIGS. 1, 2, 4, 7 and 10-14, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in, for example, FIGS. 1, 2, 4, 7 and 10-14. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of exemplary embodiments, those skilled in the art will recognize that the invention can be practiced with modifications and in the spirit and scope of the appended claims.

What is claimed:
1. A design process for comprising, manufacturing, or testing an integrated circuit, the integrated circuit comprising:
   a conductive structure surrounding a circuit device arranged on a substrate; and
   at least one feed through device associated with the conductive structure and providing signals to the device,
   wherein the substrate comprises one of a silicon substrate and a wafer;
   the conductive structure comprises a bottom arranged within the substrate;
   the conductive structure comprises a box comprising a cover, sidewalls, and the bottom;
   the cover comprises a layer of metal above the substrate;
   the bottom comprises a doped region of the substrate;
   the sidewalls are partially within the substrate and extend out of and above the substrate;
   the sidewalls comprise a doped portion of the substrate and at least one via;
   the conductive structure is an on-chip shielding structure;
   the at least one via of the sidewalls comprises a plurality of vias arranged one on top of another in a plurality of wiring levels over the substrate; and
   one of the plurality of vias is formed on the doped portion of the substrate.

* * * * *